(12) United States Patent
Ohshita et al.

(10) Patent No.: US 11,252,507 B2
(45) Date of Patent: Feb. 15, 2022

(54) DYNAMICS PROCESSING METHOD AND DYNAMICS PROCESSING DEVICE

(71) Applicant: YAMAHA CORPORATION, Hamamatsu (JP)

(72) Inventors: Hayato Ohshita, Hamamatsu (JP); Toshifumi Kunimoto, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 1 day.

(21) Appl. No.: 17/026,741

(22) Filed: Sep. 21, 2020

(65) Prior Publication Data

US 2021/0006902 A1 Jan. 7, 2021

Related U.S. Application Data

(63) Continuation of application No. PCT/JP2019/010808, filed on Mar. 15, 2019.

(30) Foreign Application Priority Data

Mar. 23, 2018 (JP) .............................. JP2018-057218

(51) Int. Cl.
*H04R 3/04* (2006.01)
*H04B 17/309* (2015.01)
(Continued)

(52) U.S. Cl.
CPC ................. *H04R 3/04* (2013.01); *H03G 3/20* (2013.01); *H03G 7/00* (2013.01); *H04B 17/309* (2015.01); *H04R 2430/01* (2013.01)

(58) Field of Classification Search
CPC ........ H04R 3/00; H04R 3/04; H04R 2430/01; H04B 17/309; H03G 3/20; H03G 3/3005;
(Continued)

(56) References Cited

U.S. PATENT DOCUMENTS 5,923,768 A * 7/1999 Frindle .................. H03G 7/007
381/106
6,084,974 A 7/2000 Niimi
(Continued)

FOREIGN PATENT DOCUMENTS

JP H06334459 A 12/1994
JP 2011035870 A 2/2011
JP 2012104992 A 5/2012

OTHER PUBLICATIONS

International Search Report issued in Intl. Appln. No. PCT/JP2019/010808 dated Jun. 18, 2019. English translation provided.
(Continued)

*Primary Examiner* — Xu Mei
(74) *Attorney, Agent, or Firm* — Rossi, Kimms & McDowell LLP

(57) ABSTRACT

A dynamics processing method including receiving an input audio signal determining whether a level of the input audio signal exceeds a threshold value, determining whether a first amount of time, that is not specified to a unique value by a first speed at which a gain applied to the input audio signal is changed, has elapsed from when the level of the input audio signal exceeded the threshold value, and changing the gain applied to the input audio signal at the first speed.

12 Claims, 10 Drawing Sheets

(51) Int. Cl.
*H03G 7/00* (2006.01)
*H03G 3/20* (2006.01)

(58) Field of Classification Search
CPC ........ H03G 3/3089; H03G 5/00; H03G 5/005; H03G 5/02; H03G 5/025; H03G 7/00
USPC ................................ 381/104, 107, 109, 106
See application file for complete search history.

(56) References Cited

U.S. PATENT DOCUMENTS

| | | | |
|---|---|---|---|
| 9,413,322 B2* | 8/2016 | Soulodre | H03G 9/025 |
| 9,559,650 B1* | 1/2017 | Skovenborg | H03G 7/002 |
| 10,331,400 B1* | 6/2019 | Chen | G06F 3/165 |
| 2007/0195975 A1* | 8/2007 | Cotton | H04S 7/40 |
| | | | 381/104 |
| 2012/0114127 A1 | 5/2012 | Yamashita | |
| 2013/0272543 A1* | 10/2013 | Tracey | H03G 5/005 |
| | | | 381/107 |
| 2015/0125001 A1* | 5/2015 | Shimizu | G10H 1/0091 |
| | | | 381/104 |
| 2015/0263690 A1* | 9/2015 | Goto | H03G 7/002 |
| | | | 381/56 |

OTHER PUBLICATIONS

Written Opinion issued in Intl. Appln. No. PCT/JP2019/010808 dated Jun. 18, 2019.

* cited by examiner

DYNAMICS PROCESSING METHOD AND DYNAMICS PROCESSING DEVICE

CROSS REFERENCE TO RELATED APPLICATIONS

The present application is a continuation application of International Patent Application No. PCT/JP2019/010808, filed on Mar. 15, 2019, which claims priority to Japanese Patent Application No. 2018-057218, filed on Mar. 23, 2018. The contents of these applications are incorporated herein by reference in their entirety.

BACKGROUND

1. Technical Field

One embodiment of the invention relates to dynamics processing of an audio signal.

2. Description of the Related Art

There is a dynamics system effector (a dynamics processing device), such as a compressor, for controlling a temporal change in level of an audio signal. For instance, when a level of an input audio signal exceeds a threshold value, the compressor performs compression (volume control) of the input audio signal with a time constant corresponding to attack time. After that, when the level of the input audio signal falls below the threshold value, the compressor stops the compression with a time constant corresponding to release time. The dynamics processing is generally controlled by using parameters such as Threshold value indicating a threshold value, Ratio indicating a depth of the compression, Attack indicating attack time, and Release indicating release time. A user adjusts these parameters to control the dynamics processing device. As a technical literature related to the compressor, Unexamined Japanese Patent Publication No. H06-334459 is disclosed, for example.

SUMMARY

When a level of an input audio signal rises, some conventional compressors may start compression behind its rising timing. In this case, the input audio signal, which is not subjected to compression, may be outputted from the compressor until the compression is started. The inventors have found that, when an audio signal is processed by a compressor, delay time from a rise timing of a level of the input audio signal to a start of compression gives an important influence on characteristics of the processed audio signal. Until now, however, no attention has been paid to the delay time as a control target. In a typical dynamics control device, delay time is determined depending on an Attack parameter to be set. Therefore, it has been difficult to control the delay time independently. More specifically, in Unexamined Japanese Patent Publication No. H06-334459, a value of the delay time is inversely proportional to rising speed of log level codes (a unit is, for example, dB/sec) (or substantially proportional to a time constant indicated by the Attack parameter). Thus, the delay time is uniquely determined, so that the control of characteristics of an audio signal is made uniform.

In view of the above-mentioned problem, and aims to provide a dynamics processing method in which delay time from a rise timing of a level of an input audio signal to a start of gain change (e.g., compression) can be controlled to delay time that is not uniquely determined with respect to the Attack parameter, more specifically, a value changing in a relationship deviating from a predetermined direct proportion to the Attack parameter.

A preferred embodiment of the invention provides a dynamics processing method for receiving an input audio signal, determining whether a level of the input audio signal exceeds a threshold value, determining, in a case where it is determined that the level of the input audio signal exceeds the threshold value, whether a first amount of time, that is not specified to a unique value by a first speed at which a gain applied to the input audio signal is changed, has elapsed from when the level of the input audio signal exceeded the threshold value; and changing, in a case where it is determined that the level of the input audio signal exceeds the threshold value and that the first amount of time has elapsed from when the level of the input audio signal exceeded the threshold value, the gain applied to the input audio signal at the first speed.

In the dynamics processing method of the A preferred embodiment of the invention, a change in input audio can be controlled more freely, which has been conventionally difficult to be achieved.

DETAILED DESCRIPTION

Hereinafter, embodiments will be described below with reference to the drawings.

First Embodiment

Figure 1:
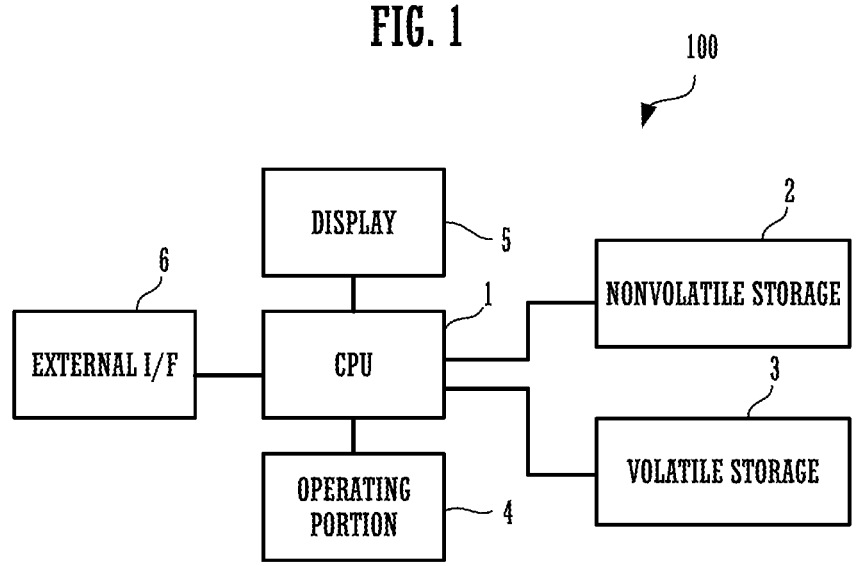
FIG. 1 is a block diagram showing a configuration of a dynamics processing device that performs a dynamics processing method in accordance with a first embodiment.

FIG. 1 is a block diagram showing a configuration of a dynamics processing device 100 that performs a dynamics processing method in accordance with a first embodiment. The dynamics processing device 100 is configured to install a dynamics processing program for performing a dynamics processing method in accordance with the present embodiment, with respect to a computer such as a personal computer.

As shown in FIG. 1, the dynamics processing device 100 includes a CPU 1, a nonvolatile storage 2, a volatile storage 3, an operating portion 4, a display 5, and an external I/F 6.

The nonvolatile storage 2 is constituted by a flash memory, an HDD (hard disk drive), or the like. Various kinds of programs, which are to be executed by the CPU 1, are stored in the nonvolatile storage 2. The dynamics processing program in accordance with the present embodiment is included in these programs.

The volatile storage 3 is constituted by a RAM or the like, and used as a work area when the CPU 1 executes the programs.

The operating portion 4 is constituted by various kinds of operating elements such as a keyboard and a mouse.

The display 5 is a liquid crystal display panel, for example.

The CPU 1 transmits and receives information to/from a user through the operating portion 4 and the display 5, and executes various kinds of programs stored in the nonvolatile storage 2.

The external I/F 6 is constituted by a network I/F, a memory I/F, and the like. Herein, the network I/F communicates with an external device through a network such as the Internet, and the memory I/F transmits and receives information to/from a storage medium.

Further, the external I/F has a function that converts an analog audio signal, which is supplied from the outside, into a digital audio signal. The CPU 1 obtains the input audio signal, serving as a processing target of the dynamics processing, from the outside through the external I/F 6. Further, the external I/F 6 has a function that converts a digital audio signal into an analog audio signal. The CPU 1 outputs the output audio signal, which is subjected to the dynamics processing, to the outside through the external I/F 6.

Figure 2:
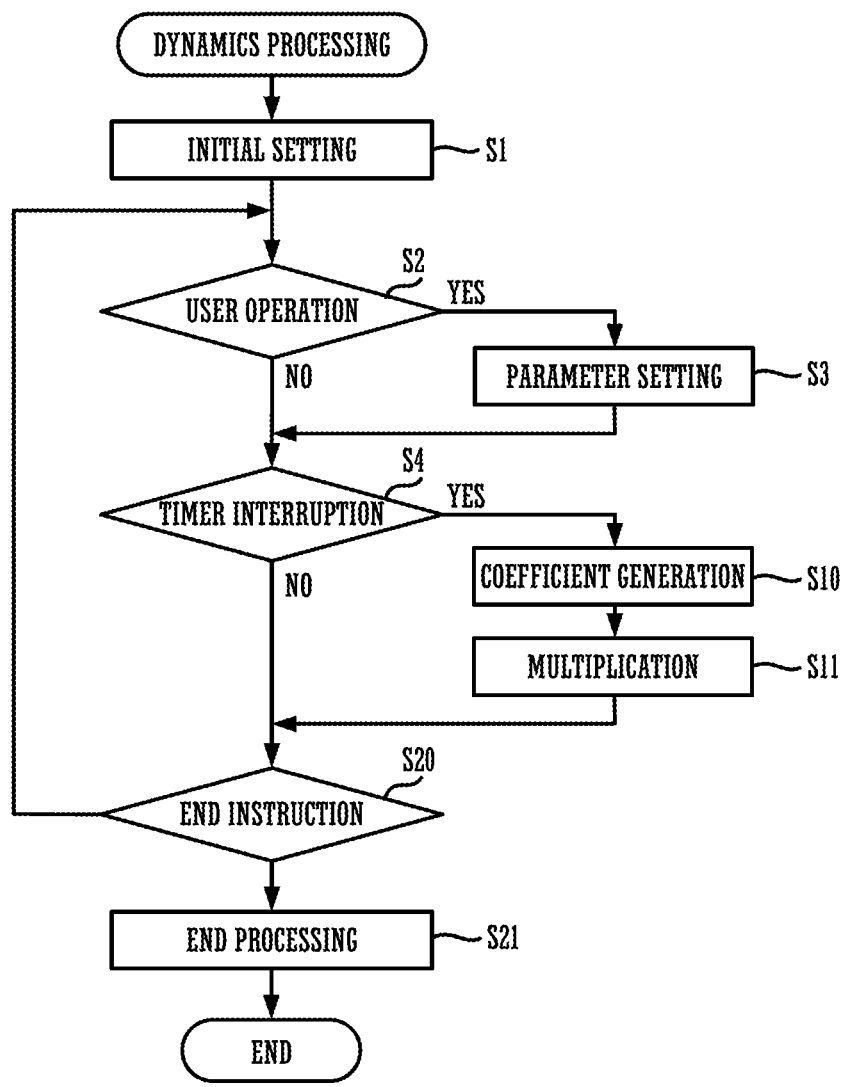
FIG. 2 is a flowchart showing content of a dynamics processing program that performs the dynamics processing method.

FIG. 2 is a flowchart of a dynamics processing program executed by the dynamics processing device 100 of the present embodiment. After performing initial setting (step s1) of the external I/F 6, a timer (not shown), various kinds of parameters (not shown), and the like, the program enters an event waiting loop of multi-task operation. When an event occurs, the program performs processing corresponding to the event. For instance, when the operating portion 4 detects an operation, which is operated by a user, in the operating portion 4 (step s2), the CPU 1 performs parameter setting processing (step s3). In response to timer interruption that occurs in every sampling period, the CPU 1 obtains an input audio signal from the external I/F 6. The CPU 1 applies coefficient generation processing (step s10) and multiplication processing (step s11) to the obtained audio signal. The CPU 1 outputs the processed audio signal to external I/F 6.

Since the dynamics processing device 100 is a multitask operating system, the processing is interruptively performed according to the timer interruption, even while the parameter setting is performed. Therefore, the input audio signal is not interrupted.

In the dynamics processing device 100, a plurality of sampling periods may be set as a timer interruption interval. Thus, for each timer interruption, the coefficient generation processing and the multiplication processing may be performed collectively. Typically, audio signals are collected over a plurality of sampling periods, and transmitted and received between the external I/F 6 and a computer for performing audio processing. If the external I/F 6 transmits and receives audio signals collectively at a few tens of sample units, the latency from input to output of the audio signals will be several milliseconds. Thus, a user can hardly perceive delay.

Further, in response to an end instruction from a user (step s20), the CPU 1 performs end processing such as releasing resources (step s21), and completes the program.

In the dynamics processing device 100 of the present embodiment, a compressor will be described as an example of a dynamics system effector. In addition to each parameter, i.e., Threshold value, Ratio, Attack, Release, and Htime serving as parameters of a typical compressor, the dynamics processing device 100 of the present embodiment sets a Dtime parameter in step s3.

In the coefficient generation processing (step s10), it is supposed that a level of an input audio signal rises. If the level of the input audio signal is continuously smaller than Threshold value, a coefficient (gain) having a predetermined value will be generated. Further, if the level of the input audio signal exceeds Threshold value, the coefficient (gain) will be generated so as to decrease at a first speed (rate), which is indicated by Attack, according to an excess amount of the level from Threshold value in the coefficient generation processing. Further, it is supposed that a level of an input audio signal falls. If the level of the input audio signal, which has exceeded Threshold value, crosses Threshold value and falls below Threshold value, a coefficient (gain) will be generated so as to increase from a zero at a second speed (rate), which is indicated by Release, according to an amount of the level falling below Threshold value in the coefficient generation processing (step s10).

Further, in the coefficient generation processing (step s10) of the present embodiment, the operation in which the coefficient is decreased according to the excess amount is delayed by a first amount of time indicated by Dtime. In other words, a start timing of the operation in which the coefficient is decreased according to the excess amount is delayed in the coefficient generation processing (step s10). Further, in addition to a process in which the operation is delayed by the first amount of time indicated by Dtime, the coefficient generation processing includes another process, i.e., the operation in which the coefficient is increased according to the amount of the level falling below Threshold value is delayed by a second time indicated by Htime.

Figure 3:
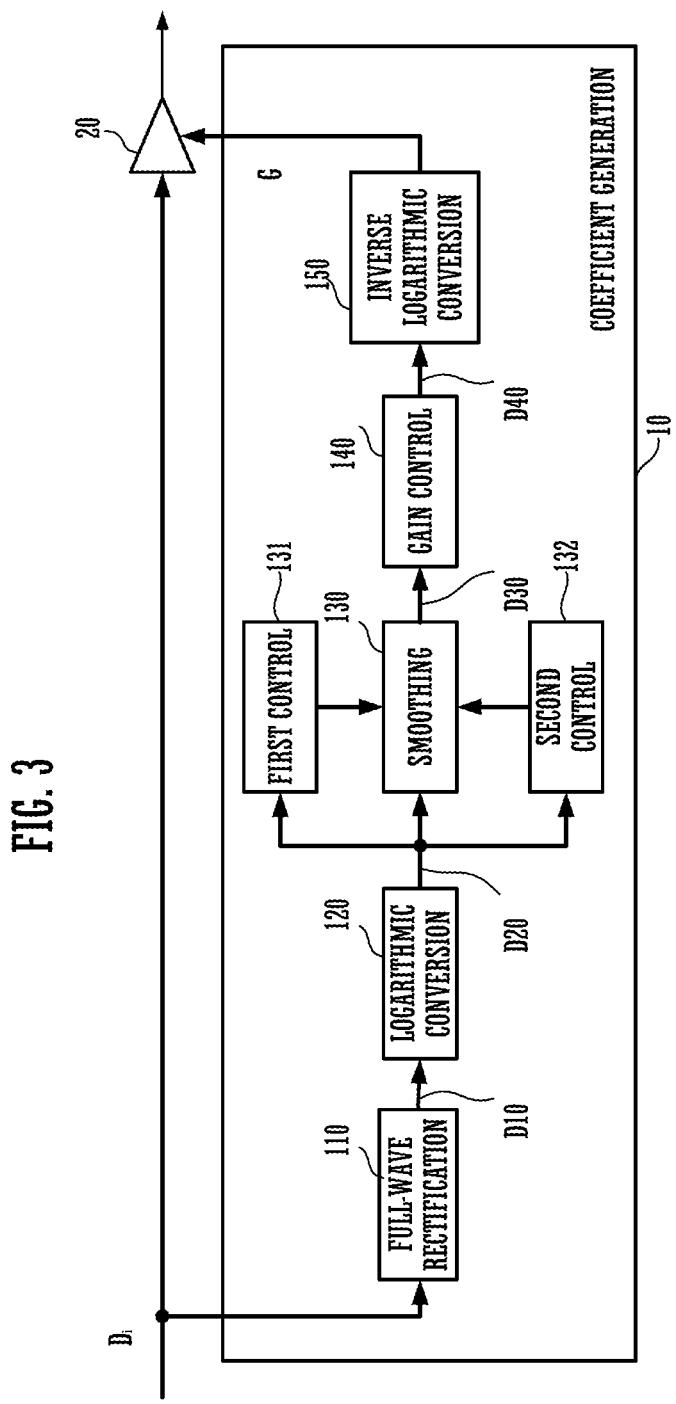
FIG. 3 is a block diagram showing a functional configuration of a dynamics processing device achieved by executing the dynamics processing program.

FIG. 3 is a functional block diagram of a compressor achieved by executing a dynamics processing program through the CPU 1 in the present embodiment. As shown in FIG. 3, the compressor includes a coefficient generator 10 and a multiplier 20, as its function. The coefficient generator 10 shown in this example corresponds to a timing controller of the present invention. Further, the multiplier 20 shown in this example corresponds to a dynamics processor of the present invention.

In FIG. 3, an input audio signal Di is supplied to the compressor one sample by one sample in each sampling period, for example.

The coefficient generator 10 is means for generating a coefficient by which the input audio signal Di is multiplied. The coefficient generator 10 corresponds to the coefficient generation processing (step s10) shown in FIG. 2.

Further, the multiplier 20 multiplies the input audio signal Di by the coefficient, which is generated by the coefficient generator 10. The multiplier 20 is means for outputting an audio signal Do as a multiplication result, which corresponds to the multiplication process (step s11) shown in FIG. 2.

A full-wave rectifier 110 of the coefficient generator 10 applies full-wave rectification to the input audio signal Di having positive and negative signs, and outputs the full-wave rectified signal D10 to a logarithm converter 120.

The logarithm converter 120 converts the signal D10, which is a positive real number, into a logarithmic value. After that, a signal D20, which is converted into the logarithmic value, is outputted to a smoother 130, a first controller 131, and a second controller 132. An envelope waveform (a waveform of which peaks in every pitch period are connected, not shown) of the signal D20 corresponds to a level of the input audio signal (hereinafter, referred to as an "input level").

The smoother 130 is connected to the first controller 131 and the second controller 132. The smoother 130 smooths the signal D20, and outputs a smoothed signal D30 to a gain controller 140. The smoother 130 generates the signal D30 that increases with a time constant indicated by Attack in response to the fact that the level of the signal D20 rises (reference timing). Further, the smoother 130 generates the signal D30 that decreases with a time constant indicated by Release in response to the fact that the level of the signal D20 falls. At this time, the first controller 131 performs control such that a rise timing of the signal D30 is delayed by a first amount of time (delay time) indicated by Dtime, in response to the fact that the level of the signal D20 rises. The second controller 132 performs control such that a fall timing of the signal D30 is delayed by a second time (hold time) indicated by Htime, in response to the fact that the level of the signal D20 falls.

Figure 4:
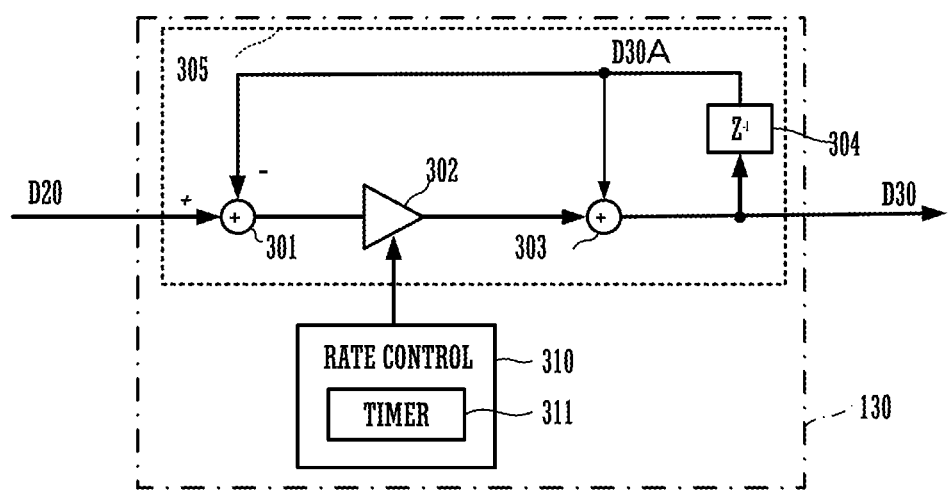
FIG. 4 is a block diagram showing a configuration example of a smoother of the dynamics processing device.

FIG. 4 is a block diagram showing a configuration example of the smoother 130. In this example, the smoother 130 is constituted by a subtractor 301, a multiplier 302, an integrator 305, and a rate controller 310. Herein, the integrator 305 is constituted by an adder 303 and a delay 304. This example shows that the smoother 130 causes the rate controller 310 to control the timings according to Dtime supplied from the first controller 131 and Htime supplied from the second controller 132 in FIG. 3. The details will be described as follows.

In the subtractor 301, a signal D30A of the delay 304 in the integrator 305 is subscribed from the signal D20, and outputted to the multiplier 302. The signal D30A is obtained such that the delay 304 delays the signal D30 by one sampling period. In the multiplier 302, a signal of "D20-D30A" outputted from the subtractor 301 is multiplied by a rate supplied from a rate controller 310, and outputted to the integrator 305. The integrator 305 integrates the output signal of the multiplier 302. An output signal of the adder 303 in the integrator 305 corresponds to the signal D30.

The rate controller 310 has a timer 311. The rate controller 310 causes the timer 311 to count the first amount of time indicated by Dtime or the second time indicated by Htime, in response to the fact that the signal D20 crosses Threshold value.

Specifically, at the timing (reference timing in an increase direction of the level) when the envelope waveform (input level) of the signal D20 crosses Threshold value, if the output signal of the subtractor 301 has substantially a positive polarity, the rate controller 310 will detect that the input level has risen. The rate controller 310 causes the timer 311 to count the first amount of time from when the input level has risen. Further, after the envelope waveform (input level) of the signal D20 crosses Threshold value, if the output signal of the subtractor 301 has a negative polarity, the rate controller 310 will detect that the input level has fallen. The rate controller 310 causes the timer 311 to count the second time from when the input level has fallen.

During the time counting of the first amount of time or the second time performed by the timer 311, the rate controller 310 continues to supply a rate value of "0" to the multiplier 302.

When the timer 311 completes the counting of the first amount of time or the second time, a rate depending on the polarity of the output signal of the subtractor 301 is supplied to the multiplier 302 from the rate controller 310. Specifically, if the output signal of the subtractor 301 has a positive polarity, the rate controller 310 will supply the rate indicated by Attack (hereinafter, referred to as "Attack rate") to the multiplier 302. Further, if the output signal of the subtractor 301 has a negative polarity, the rate controller 310 will supply the rate indicated by Release (hereinafter, referred to as "Release rate") to the multiplier 302.

In the multiplier 302, the output signal of the subtractor 301 is multiplied by the rate, which is supplied from the rate controller 310 in this way, and outputted to the integrator 305. The integrator 305 integrates the output signal of the multiplier 302, and outputs the integrated value as the signal D30.

In FIG. 3, based on the signal D30 outputted from the smoother 130, the gain controller 140 outputs a gain D40. The signal D30, which is outputted from the smoother 130, follows the signal D20 according to the rate supplied to the multiplier 302.

Figure 5:
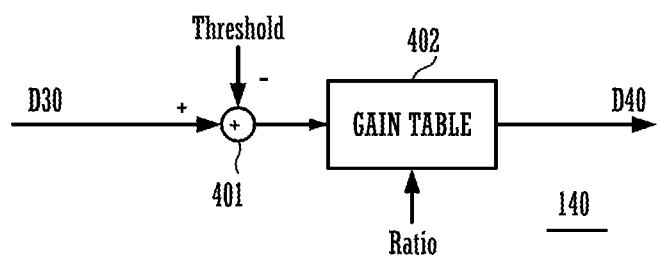
FIG. 5 is a block diagram showing a configuration example of a gain controller of the dynamics processing device.

FIG. 5 is a block diagram showing a configuration example of the gain controller 140. In the example shown in FIG. 5, the gain controller 140 has a subtractor 401 and a gain table 402. The subtractor 401 subtracts Threshold value from the signal D30, which is outputted from the smoother 130, and outputs a signal of "D30-Threshold" as the subtraction result. In other words, an amount (excess amount) of the signal level that exceeds Threshold value is outputted to the gain table 402 from the subtractor 401.

Figure 6:
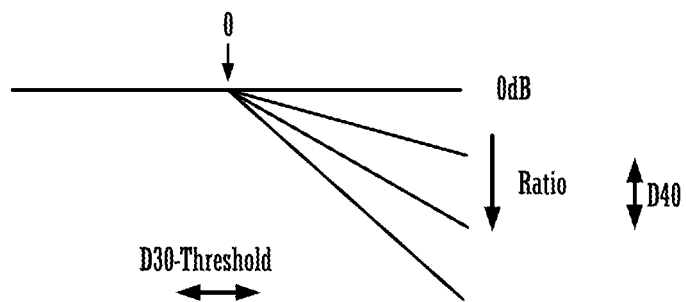
FIG. 6 is a diagram showing content of a gain table of the gain controller.

The gain table 402 is a table for associating the signal of "D30-threshold value," which is outputted from the subtractor 401, with the gain D40, which is a logarithmic value, according to each value of Ratio. FIG. 6 is a diagram showing content of the gain table 402. In a region where the signal of "D30-threshold value," which is outputted from the subtractor 401, has a negative value, the gain table 402 outputs a reference gain (0 dB) to an inverse logarithm converter 150 as the gain D40, regardless of Ratio. In a region where the signal of "D30-threshold value," which is outputted from the subtractor 401, has a positive value, the gain table 402 outputs, as the gain D40, a value (a value corresponding to Ratio and the excess amount) that increases in a negative direction at a gradient according to Ratio as the signal of "D30-Threshold value" increases. Note that, the table may be replaced by any arithmetic operation that has the equivalent input/output characteristics thereto.

In FIG. 3, the inverse logarithm converter 150 converts the gain D40, which is a logarithmic value outputted from the gain table 402 in such a manner, into a gain G that is a positive real value, and supplies the gain G to the multiplier 20. The multiplier 20 multiplies the input audio signal Di by the gain G. The multiplier 20 outputs an audio signal Do as a multiplication result. Note that, the gain controller 140 may modify the gain table 402 to output a real number gain G, instead of the logarithm gain D40. Thus, the inverse logarithm converter 150 can be eliminated.

The configuration of the dynamics processing device 100 in accordance with the present embodiment has been described in detail above.

Figure 7:
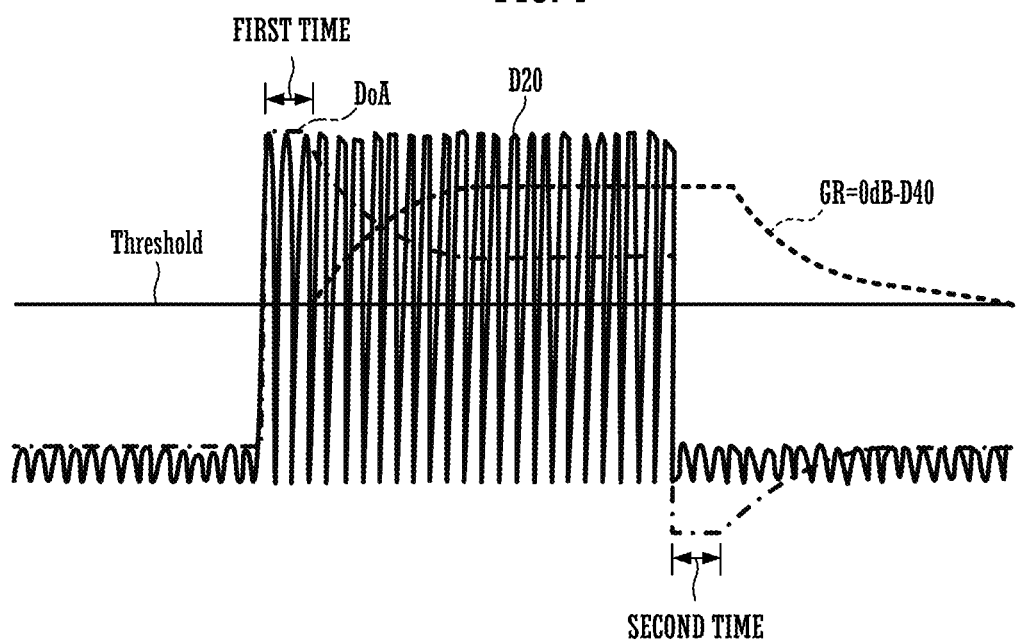
FIG. 7 is a waveform diagram showing a waveform of each part of the dynamics processing device.
Figure 8:
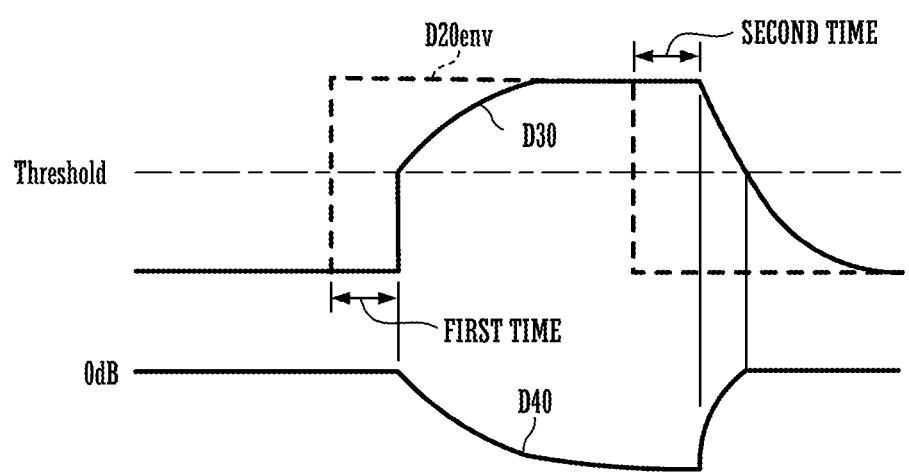
FIG. 8 is a waveform diagram showing a waveform of each part of the dynamics processing device.

FIGS. 7 and 8 are waveform diagrams each showing a signal waveform in each part of the dynamics processing device 100 in accordance with the present embodiment. In these waveform diagrams, a horizontal axis denotes a time axis, and a vertical axis denotes a signal value of the signal waveform in each part.

FIG. 7 shows a waveform of the signal D20, an envelope waveform DoA of the audio signal Do, and a waveform of a gain reduction amount GR. Herein, the gain reduction amount Gr, which is the gain D40 having a logarithmic value outputted from the gain controller 140, indicates how much the audio signal is lowered from an audio signal of 0 dB (reference level) in decibel units. Further, FIG. 8 shows an envelope waveform D20env of the signal D20 shown in FIG. 7, and waveforms of signals D30 and D40.

In the examples shown in FIGS. 7 and 8, the envelope waveform D20env corresponding to the level of the input audio signal crosses Threshold value and rises in a stepwise manner. After keeping a fixed level during a predetermined period of time, the envelope waveform D20env crosses Threshold value and falls in a stepwise manner.

When the envelope waveform D20env, which indicates the input level, exceeds Threshold value, the smoother 130 counts the first amount of time indicated by Dtime. During this period, a coefficient of 0 is supplied to the multiplier 302. Accordingly, during the counting of the first amount of time, the signal D30 is not changed as shown in FIG. 8. Therefore, the signal D30 does not exceed Threshold value. Thus, the gain reduction amount GR is maintained to be 0 dB over the first amount of time as shown in FIG. 7. Accordingly, the input audio signal Di is outputted from the multiplier 20 as the audio signal Do, while keeping the level as it is. Therefore, during the first amount of time, the envelope waveform DoA of the audio signal Do is the same as the envelope waveform of the signal D20.

In the smoother 130, when the counting of the first amount of time is completed, an integral value of the integrator 305 is initialized to Threshold value by the rate controller 310, and an Attack rate or a Release rate is outputted to the multiplier 302 from the rate controller 310. As a result, the signal D30, which indicates an integral value of the integrator 305, rises from Threshold value at a following speed depending on the Attack rate, according to the excess amount of the input level from Threshold value. Strictly, after the first amount of time elapses, the signal D30 rises according to the Attack rate during a period of time when the signal D20 is higher than Threshold value. Further, the signal D30 falls according to the Release rate during a period of time when the signal D20 is lower than Threshold value. The above-mentioned behavior is repeated. The Attack rate, however, is much larger (fast) than the Release rate, typically. Therefore, when the input level is large, the following speed of the signal D30 is substantially determined depending on the Attack rate.

After the signal D30 exceeds Threshold value, the gain reduction amount GR of the gain D40 increases at a gradient indicated by Ratio, according to the excess amount of the signal D30 from Threshold value. Herein, the gain reduction amount GR is outputted from the gain controller 140. As a result, the compression, which is indicated by the gain reduction amount GR shown in FIG. 7, is applied to the input audio signal Di, so that an envelope waveform DoA of the audio signal Do decreases with elapse of time.

In the smoother 130, when the envelope waveform (input level) of the signal D20 falls below Threshold value, the rate controller 310 starts counting of a second time indicated by Htime. During the counting of the second time, the smoother 130 continues to output a rate value of "0" to the multiplier 302 from the rate controller 310. As shown in FIG. 8, the signal D30 is not changed during the counting of the second time. Consequently, the gain D40 at start of the counting is maintained as shown in FIG. 7.

When the counting of the second time is completed, the rate controller 310 outputs the Attack rate or the Release rate to the multiplier 302 in the smoother 130. In this case, at the time when the counting of the second time is completed, the signal D30 is continuously large as compared with the signal D20. Accordingly, Release is outputted to the multiplier 302 from the rate controller 310. As a result, the signal D30 attenuates with a time constant depending on Release, as shown in FIG. 8. While the signal D30 is larger than Threshold value, the gain D40 increases toward 0 dB according to the attenuation of the signal D30. Thus, the gain reduction amount GR is attenuated toward 0 dB, as shown in FIG. 7.

As mentioned above, in the dynamics processing device 100 of the present embodiment, a smoothed signal changing in response to the fact that a level of the input audio signal Di rises is generated based on Attack and Release. In this process, when only the first amount of time has elapsed from when the input level rises, the dynamics processing device 100 of the present embodiment starts to change the smoothed signal. Thus, the dynamics processing device 100 can control the delay time, i.e., from when the level of the input audio signal Di rises to when application of the compression is started, independently from an operation of other parameters such as Attack and Threshold value.

Further, in a process in which a smoothed signal changing in response to the fact that a level of the input audio signal Di falls is generated based on Release, the dynamics processing device 100 of the present embodiment delays the start of changing the smoothed signal by a second time. Accordingly, the dynamics processing device 100 can control the delay time, i.e., from when the level of the input audio signal Di falls to when operation of the compression is stopped, independently from an operation of other parameters such as Release and Threshold value.

Thus, in the dynamics processing device 100 of the present embodiment, a change in input audio can be controlled more freely, which has conventionally been difficult to be achieved.

Second Embodiment

Figure 9:
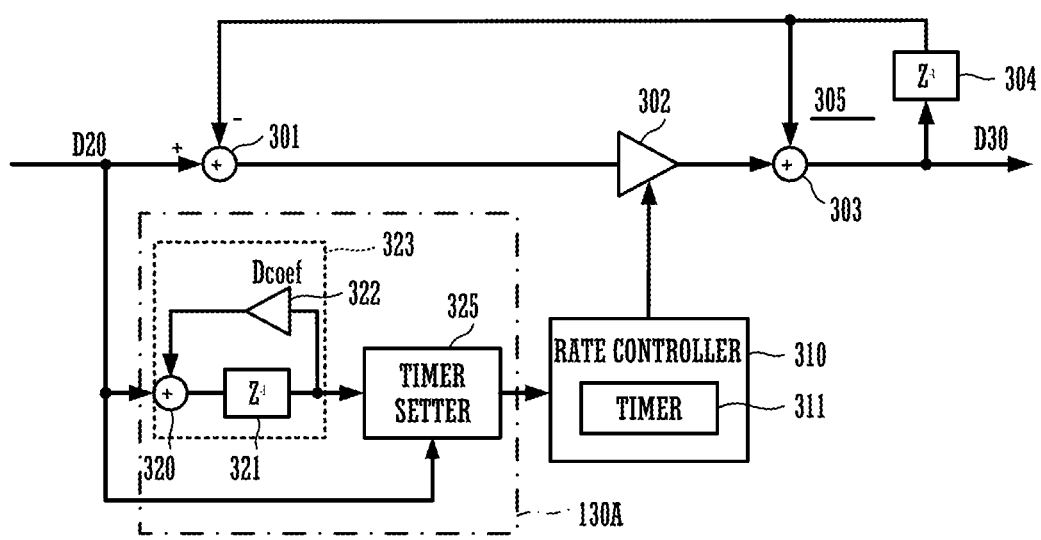
FIG. 9 is a block diagram showing a configuration of a smoother of a dynamics processing device in accordance with a second embodiment.

For a compressor in accordance with a second embodiment of the present invention, the smoother 130 in the first embodiment is replaced by a smoother 130A shown in FIG. 9. To configure the smoother 130A, a timer setter 325 and an LPF 323, which is constituted by an adder 320, a delay 321, and a multiplier 322, are added to the smoother 130 shown in FIG. 4. Herein, a coefficient Dcoef for adjusting a time constant of the LPF 323 is given to the multiplier 322. The coefficient Dcoef is set in the parameter setting processing (step s3) (see FIG. 2).

In the present embodiment, the LPF 323 performs processing that integrates the signal D20. The timer setter 325 sets a first amount of time in the timer 311 of the rate controller 310. The first amount of time corresponds to an output value (integral value) of the LPF 323 at a timing when an envelope waveform (input level) of the signal D20 exceeds Threshold value. Specifically, when the integral value of the LPF 323 is 0, the first amount of time is set to the maximum value Dmax. The timer setter 325 decreases the first amount of time gradually, with increase of the integral value. Note that, in the present embodiment, the second time is set based on Htime, similarly to the first embodiment.

In the dynamics processing device 100 of the present embodiment, the first amount of time changes depending on a manner how the input level (an envelope waveform of the signal D20) has changed until the input level reaches Threshold value. In the dynamics processing device 100, when the input level rises quickly and exceeds Threshold value, the integral value of an LPF 323 is decreased, so that the first amount of time is increased. As a result, for a quickly rising audio signal, it takes a little longer time until application of the compression is started. On the other hand, in the dynamics processing device 100, when the input level rises gradually and exceeds Threshold value, the integral value of the LPF 323 is increased, so that the first amount of time is decreased. As a result, for a slowly rising audio signal, application of the compression is performed without being significantly delayed from when the audio signal rises. Note that, instead of the LPF 323, an integrator may be used in the dynamics processing device 100.

Other Embodiment

As mentioned above, the first to second embodiments of the present invention have been described, but other embodiments may be included in the present invention. The other embodiments are as follows, for example.

Figure 10:
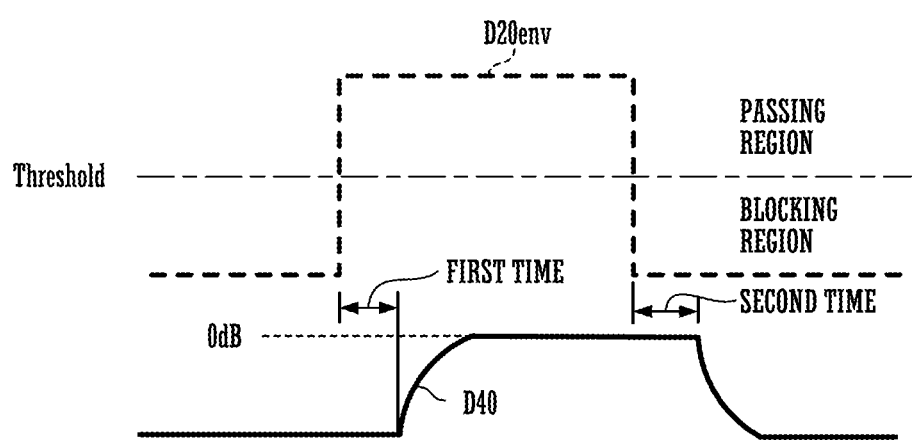
FIG. 10 is a waveform diagram showing a gate processing method in accordance with another embodiment of the dynamics processing method.

(1) In each embodiment mentioned above, a compressor is described as an example, but the present invention is applicable to any other type of dynamics processing that dynamically controls a gain based on Threshold value and an input level of a limiter, a gate, an expander, and the like. FIG. 10 is a waveform diagram showing an operation example when the above-mentioned first embodiment is applied to a gate. The gate is a dynamics processor that passes a signal whose level is higher than Threshold value, and blocks a signal whose level is lower than Threshold value. In the example applied to the gate shown in FIG. 10, it is supposed that the envelope waveform D20env indicating an input level crosses Threshold value and rises. When the first amount of time indicated by Dtime has elapsed from that point of time, the gain D40 rises according to an Attack rate in response to the fact that the input level exceeds Threshold value. Thus, in the dynamics processing device to which the gate is applied, the input level rises toward a reference level (0 dB) from a zero level (−∞ dB).

Further, in the dynamics processing device of this example, it is supposed that the envelope waveform D20env indicating the input level crosses Threshold value and falls. When the second time indicated by Htime has elapsed from that point of time, the gain D40 falls according to a Release rate in response to the fact that the input level falls below Threshold value. The input level is decreased to the zero level from the reference level.

(2) In each embodiment mentioned above, a user may set a value of Dtime as an independent parameter. In that case, the user can set Dtime independently from a value of Attack. Alternatively, the value of Dtime may be set to a value determined by an interlocking function whose argument is any of other user-settable parameters such as Threshold value, Attack, Release, Ratio, Output Gain, and Knee. For instance, it is supposed that an interlocking function whose argument is Attack is employed. If the interlocking function is a function other than direct proportion, in conjunction with a value of Attack serving as a time constant, a user can set Dtime to a value not directly proportional to the value of Attack. Further, a user can change the value of Dtime without changing it independently from Attack. Parameters to be used as the argument are preferably Ratio, Threshold value, or the like. Furthermore, the interlocking function used for interlocking the value may be made user-editable. For instance, a user may determine which one of these parameters such as Threshold value, Attack, Release, Ratio, Output Gain, and Knee is used as an argument of the interlocking function. In other words, the user may determine which parameter is interlocked to Dtime. In this case, by the user, not only one parameter but also a plurality of parameters may be interlocked to Dtime. Further, in the second embodiment, Dtime may be interlocked to the integral value of the audio signal at the time when the input level crosses Threshold value, and any parameters other than Dtime. Alternatively, Dtime may be interlocked to any one of values such as the signal D30, a differential value of the signal D30, the gain reduction amount GR, a differential value of the gain reduction amount GR in each embodiment.

(3) An aspect in which Dtime is interlocked to a value of Threshold value will be described in the following. In the dynamics processing device of this example, the larger the value of Threshold value is (i.e., the shallower the compression is, or the smaller the gain reduction amount GR is), the longer Dtime is. Further, the smaller the value of Threshold value is, the shorter Dtime is. According to this aspect, more natural sound quality can be obtained when the compression is shallow, and more reliable compression can be obtained when the compression is deep. Further, in the dynamics processing device, Dtime may be interlocked to the value of Threshold value in an inverse manner. By doing so, the compression is reliably applied even when the compression is shallow, and a natural sound quality can easily be obtained even when the compression is deep. Further, in the dynamics processing device, Dtime may be interlocked to only the value of Threshold value within a certain range.

(4) In each embodiment mentioned above, the logarithm converter 120 and the inverse logarithm converter 150 are provided in the coefficient generator 10 to perform smoothing in a decibel region. The processing in a decibel region, however, is not essential. In each embodiment mentioned above, each processing in the coefficient generator 10 may be performed in a linear region to eliminate these components.

(5) In the first embodiment mentioned above, some waveforms of the audio signal may cause the situation in which, after exceeding Threshold value, the input level falls below Threshold value before counting of the first amount of time is completed. To address this case, various kinds of aspects may be considered. For instance, when, after exceeding Threshold value, the input level falls below Threshold value before the counting of the first amount of time is completed, the dynamics processing device resets a timer for counting the first amount of time at the point of time. After that, when the input level exceeds Threshold value, the dynamics processing device may cause the timer to start counting of the first amount of time.

(6) In the above-mentioned first embodiment, without participation of Attack in determining a start timing of control that changes the gain according to the Attack rate in response to the fact that the input level exceeds Threshold value, the control is started at the time when the first amount of time, which is indicated by Dtime, elapses from when the input level rises. Instead of doing so, however, Attack may be caused to participate in determining the start timing of the control in the first amount of embodiment, in addition to Dtime. Specifically, when the first amount of time elapses from when the input level rises, the above-mentioned first embodiment follows the excess amount of the input level from Threshold value according to the Attack rate, without setting an integral value of the integrator 305 to Threshold value. In this aspect, after the first amount of time elapses, the integral value of the integrator 305 rises according to the Attack rate, and the compression is started when the integral value exceeds Threshold value. Accordingly, in the dynamics processing device of this aspect, Attack and Dtime participate in determining delay time until the compression is started. Also, in this aspect, by changing Dtime without changing Attack, the start timing of the control can be changed. Therefore, in the dynamics processing device, the same effect as in the first embodiment can be obtained in this sense. In this way, the aspect that "independently" controls a start timing of compression includes an aspect that causes only Dtime to participate in determining the start timing, but other parameters such as Attack not to participate in determining the start timing. Further, aside from this, other parameters such as Attack may be added to Dtime, and newly be caused to participate in determining the start timing.

(7) In each embodiment mentioned above, the full-wave rectifier 110 may be replaced by another means for detecting a level of the input audio signal Di, such as a half-wave rectification and a square of the input audio signal Di.

What is claimed is:

1. A dynamics processing method comprising:
   receiving an input audio signal;
   determining whether a level of the input audio signal exceeds a threshold value;
   determining, in a case where it is determined that the level of the input audio signal exceeds the threshold value, whether a first amount of time, that is not specified to a unique value by a first speed at which a gain applied to the input audio signal is changed, has elapsed from when the level of the input audio signal exceeded the threshold value; and
   changing, in a case where it is determined that the level of the input audio signal exceeds the threshold value and that the first amount of time has elapsed from when the level of the input audio signal exceeded the threshold value, the gain applied to the input audio signal at the first speed.

2. The dynamics processing method according to claim 1, wherein
   the first amount of time is changed in such a manner that the first amount of time is deviated from a predetermined direct proportion to an inverse of the first speed.

3. The dynamics processing method according to claim 1, further comprising:
   integrating the input audio signal; and
   changing the first amount of time based on an integral value of the input audio signal at a time when the level of the input audio signal exceeds the threshold value.

4. The dynamics processing method according to claim 1, further comprising
   changing the first amount of time based on a value of a parameter that controls a dynamics processing device.

5. The dynamics processing method according to claim 1, wherein changing the gain applied to the input audio signal at the first speed includes decreasing the gain from a reference gain to a gain corresponding to an amount by which the level of the input audio signal exceeds the threshold value at the first speed, after the first amount of time has elapsed.

6. The dynamics processing method according to claim 1, wherein changing the gain applied to the input audio signal at the first speed includes increasing the gain from a gain of zero to a reference gain at the first speed, after the first amount of time has elapsed.

7. A dynamics processing device comprising:
   a dynamics processor configured to receive an input audio signal and apply a gain to the input audio signal; and
   a timing controller configured to:
   determine whether a level of the input audio signal exceeds a threshold value;
   determine, in a case where it is determined that the level of the input audio signal exceeds the threshold value, whether a first amount of time, that is not specified to a unique value by a first speed at which the gain applied to the input audio signal is changed, has elapsed from when the level of the input audio signal exceeded the threshold value; and
   change, in a case where it is determined that the level of the input audio signal exceeds the threshold value and that the first amount of time has elapsed from when the level of the input audio signal exceeded the threshold value, the gain applied to the input audio signal at the first speed.

8. The dynamics processing device according to claim 7, wherein
   the first amount of time is changed in such a manner that the first amount of time is deviated from a predetermined direct proportion to an inverse of the first speed.

9. The dynamics processing device according to claim 7, wherein
   the timing controller further integrates the input audio signal, and changes the first amount of time based on an integral value of the input audio signal at a time when the level of the input audio signal exceeds the threshold value.

10. The dynamics processing device according to claim 7, wherein
    the timing controller further changes the first amount of time based on a value of a parameter that controls the dynamics processing device.

11. The dynamics processing device according to claim 7, wherein
    the timing controller changes the gain applied to the input audio signal at the first speed by decreasing the gain from a reference gain to a gain corresponding to an amount by which the level of the input audio signal exceeds the threshold value, after the first amount of time has elapsed.

12. The dynamics processing device according to claim 7, wherein
    the timing controller changes the gain applied to the input audio signal at the first speed by increasing the gain from a gain of zero to a reference gain at the first speed, after the first amount of time has elapsed.

* * * * *